United States Patent
Kobayashi

(10) Patent No.: US 11,112,243 B2
(45) Date of Patent: Sep. 7, 2021

(54) ELECTRONIC COMPASS

(71) Applicant: Rohm Co., Ltd., Kyoto (JP)

(72) Inventor: Tadashi Kobayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 276 days.

(21) Appl. No.: 16/327,421

(22) PCT Filed: Aug. 24, 2017

(86) PCT No.: PCT/JP2017/030294
§ 371 (c)(1),
(2) Date: Feb. 22, 2019

(87) PCT Pub. No.: WO2018/055975
PCT Pub. Date: Mar. 29, 2018

(65) Prior Publication Data
US 2019/0242707 A1    Aug. 8, 2019

(30) Foreign Application Priority Data
Sep. 21, 2016    (JP) .............................. JP2016-184355

(51) Int. Cl.
*G01C 17/38* (2006.01)
*G01C 17/28* (2006.01)
(Continued)

(52) U.S. Cl.
CPC .............. *G01C 17/38* (2013.01); *G01C 17/28* (2013.01); *G01C 17/32* (2013.01); *G01R 33/02* (2013.01)

(58) Field of Classification Search
CPC .......... G01C 17/38; G01C 17/32; G01R 33/02
(Continued)

(56) References Cited

U.S. PATENT DOCUMENTS

| | | | | |
|---|---|---|---|---|
| 6,836,971 | B1* | 1/2005 | Wan ....................... | G01C 17/38 33/356 |
| 6,931,323 | B2* | 8/2005 | Choi ...................... | G01C 17/38 702/151 |

(Continued)

FOREIGN PATENT DOCUMENTS

| | | |
|---|---|---|
| CN | 1815141 A | 8/2006 |
| CN | 1854763 | 11/2006 |

(Continued)

OTHER PUBLICATIONS

Japan Patent Office, International Search Report for PCT/JP2017/030294 dated Nov. 28, 2017 with English translation.

*Primary Examiner* — Christopher W Fulton
(74) *Attorney, Agent, or Firm* — Fish & Richardson P.C.

(57) ABSTRACT

This electronic compass has a magnetic sensor for detecting two predetermined axis components out of the three geomagnetic axis components in a location and generating biaxial magnetic detection data corresponding to the magnitudes of the components, an acceleration sensor for detecting three axis components of the acceleration thereof and generating triaxial acceleration detection data corresponding to the three axis components, and an azimuth angle detection unit for calculating assumed magnetic detection data corresponding to the one remaining undetected axis component of the three geomagnetic axis components from the biaxial magnetic detection data, the triaxial acceleration detection data, and the magnitude and the magnetic dip of the geomagnetic field and detecting an azimuth angle by determining the component of the geomagnetic field parallel to the surface of the earth using the assumed magnetic detection data.

8 Claims, 10 Drawing Sheets

(51) Int. Cl.
   *G01C 17/32*  (2006.01)
   *G01R 33/02*  (2006.01)
(58) Field of Classification Search
   USPC .................. 33/301, 333, 334; 702/151, 150
   See application file for complete search history.

(56) References Cited

U.S. PATENT DOCUMENTS

| | | | | |
|---|---|---|---|---|
| 2003/0134665 | A1* | 7/2003 | Kato | G01C 17/28 455/566 |
| 2004/0133349 | A1 | 7/2004 | Choi et al. | |
| 2004/0187328 | A1* | 9/2004 | Satoh | G01C 17/28 33/356 |
| 2005/0183274 | A1* | 8/2005 | Cho | G01C 17/30 33/356 |
| 2005/0234676 | A1* | 10/2005 | Shibayama | G06F 1/1694 702/141 |
| 2005/0283988 | A1* | 12/2005 | Sato | G01D 3/0365 33/356 |
| 2006/0066295 | A1* | 3/2006 | Tamura | G01R 35/005 324/202 |
| 2007/0119061 | A1* | 5/2007 | Lee | G01C 17/38 33/356 |
| 2008/0319708 | A1* | 12/2008 | Cho | G01C 17/38 702/154 |
| 2016/0084652 | A1* | 3/2016 | Sekitsuka | G01C 17/28 702/94 |
| 2016/0169673 | A1* | 6/2016 | Saito | G01C 17/38 702/92 |

FOREIGN PATENT DOCUMENTS

| | | | | |
|---|---|---|---|---|
| CN | 101067554 | | 11/2007 | |
| EP | 1715292 | A1 * | 10/2006 | ............ G01C 17/38 |
| JP | H9-325029 | A | 12/1997 | |
| JP | 2005-221509 | A | 8/2005 | |
| JP | 2007-147614 | A | 6/2007 | |
| JP | 4552658 | B | 7/2010 | |
| JP | 2014-025715 | A | 2/2014 | |
| JP | 2016-061766 | A | 4/2016 | |
| WO | 2006/035505 | A1 | 4/2006 | |

\* cited by examiner

ELECTRONIC COMPASS

TECHNICAL FIELD

The present invention relates to an electronic compass.

BACKGROUND ART

Many modern handset devices such as mobile phones and smartphones are provided with an electronic compass (azimuth angle sensor) for sensing the orientation in which they find themselves.

LIST OF CITATIONS

Patent Literature
  Patent Document 1: Japanese Patent No. 4552658
Non-Patent Literature

SUMMARY OF THE INVENTION

Problem to be Solved by the Invention

Generally, in order to sense the orientation correctly, an acceleration sensor and a triaxial magnetic sensor are needed to take into consideration the inclination angle relative to the earth's surface. However, triaxial magnetic sensors often require a complicated manufacturing technology and thus they tend to be accordingly costly.

Proposed in the Patent Document 1 is a technology that enables as accurate sensing of orientation or position using a biaxial magnetic sensor, which is less expensive than a triaxial magnetic sensor, as using a triaxial magnetic sensor. This conventional technology uses a method involving sensing two axis components of geomagnetism and then estimating, using the sensed values, the third axis component of geomagnetism.

However, the magnitude of geomagnetism is known to be different between indoors and outdoors even at the same site. Thus, for example, in a situation where the magnitude of geomagnetism can change as one moves between indoors and outdoors (for example, as one enters or exits from a building), it is not always easy to estimate the third axis component of geomagnetism based only on two axis components of geomagnetism, possibly leading to insufficient azimuth angle sensing accuracy.

In light of the above-mentioned problem found by the present inventors, it is an object of the invention disclosed herein to provide an inexpensive electronic compass which can accurately sense orientation using a biaxial magnetic sensor.

Means for Solving the Problem

According to one aspect of what is disclosed herein, an electronic compass includes: a magnetic sensor which senses predetermined two axis components out of three axis components of geomagnetism at a given site to generate two-axis magnetic sensing data corresponding to the magnitudes of the respective components; an acceleration sensor which senses three axis components of acceleration applied to the sensor itself to generate three-axis acceleration sensing data corresponding to the magnitudes of the respective components; an azimuth angle detector which is configured to calculate virtual magnetic sensing data corresponding to, out of the three axis components of the geomagnetism, a remaining unsensed one axis component based on the two-axis magnetic sensing data, the three-axis acceleration sensing data, and the magnitude and the magnetic dip of the geomagnetism thereby to determine the ground-horizontal components of the geomagnetism to sense an azimuth angle (a first configuration).

In the electronic compass of the first configuration described above, preferably, the azimuth angle detector is configured to calculate, as one processing step, a ground-vertical component of the geomagnetism based on the magnitude and the magnetic dip of the geomagnetism (a second configuration).

In the electronic compass of the second configuration, the azimuth angle detector can be configured to calculate, as one processing step, an inclination angle relative to the ground surface based on the three-axis acceleration sensing data to derive a rotation matrix (a third configuration).

In the electronic compass of the third configuration, the azimuth angle detector can be configured to multiply, as one processing step, three-axis magnetic sensing data resulting from combining together the two-axis magnetic sensing data and the virtual magnetic sensing data by the rotation matrix to derive the ground-horizontal components and the ground-vertical component of the geomagnetism as a function of the virtual magnetic sensing data (a fourth configuration).

In the electronic compass of the fourth configuration, the azimuth angle detector can be configured to calculate, as one processing step, the virtual magnetic sensing data based on the known ground-vertical component of the geomagnetism to determine the ground-horizontal components of the geomagnetism (a fifth configuration).

In the electronic compass of the fifth configuration, the azimuth angle detector can be configured to sense, as one processing step, the azimuth angle based on the ground-horizontal components of the geomagnetism (a sixth configuration).

In the electronic compass of any one of the first to sixth configuration, the azimuth angle detector can be configured to determine, as one processing step, based on the two-axis magnetic sensing data that changes with time, either the maximum value of a resultant vector of the two axis components or one-half of the larger of the differences between the maximum and minimum values of the two axis components, to take the determined value as the magnitude of the geomagnetism (a seventh configuration).

In the electronic compass of any one of the first to seventh configuration, the magnetic sensor can be configured to include a hall element, a magnetoresistance (MR) element, or a magnetic impedance (MI) element (an eighth configuration).

According to another aspect of what is disclosed herein, an electronic appliance disclosed in the present description includes an electronic compass in any one of the first to eighth configuration (a ninth configuration).

According to another aspect of what is disclosed herein, an azimuth angle sensing method disclosed in the present description is a method for sensing an azimuth angle using a magnetic sensor for sensing predetermined two axis components out of three axis components of geomagnetism at a given site to generate two-axis magnetic sensing data corresponding to magnitudes of the respective two axis components, and an acceleration sensor for sensing three axis components of acceleration applied to the sensor itself to generate three-axis acceleration sensing data corresponding to the magnitudes of the respective three axis components. The method includes: alculating a ground-vertical component of the geomagnetism based on a magnitude and a magnetic dip of the geomagnetism; calculating an inclination angle relative to a ground surface based on the three-axis acceleration sensing data to derive a rotation matrix; multiplying three-axis magnetic sensing data including the two-axis magnetic sensing data and one-axis virtual magnetic sensing data by the rotation matrix to derive ground-horizontal components and the ground-vertical component of the geomagnetism as a function of the virtual magnetic sensing data; calculating the virtual magnetic sensing data based on a known ground-vertical component of the geomagnetism to determine the ground-horizontal components of the geomagnetism; sensing the azimuth angle based on the ground-horizontal components of the geomagnetism (a tenth configuration).

Advantageous Effects of the Invention

With the invention disclosed herein, it is possible to provide an inexpensive electronic compass which can accurately sense the orientation using a biaxial magnetic sensor.

DESCRIPTION OF EMBODIMENTS

<Electronic Compass>

Figure 1:
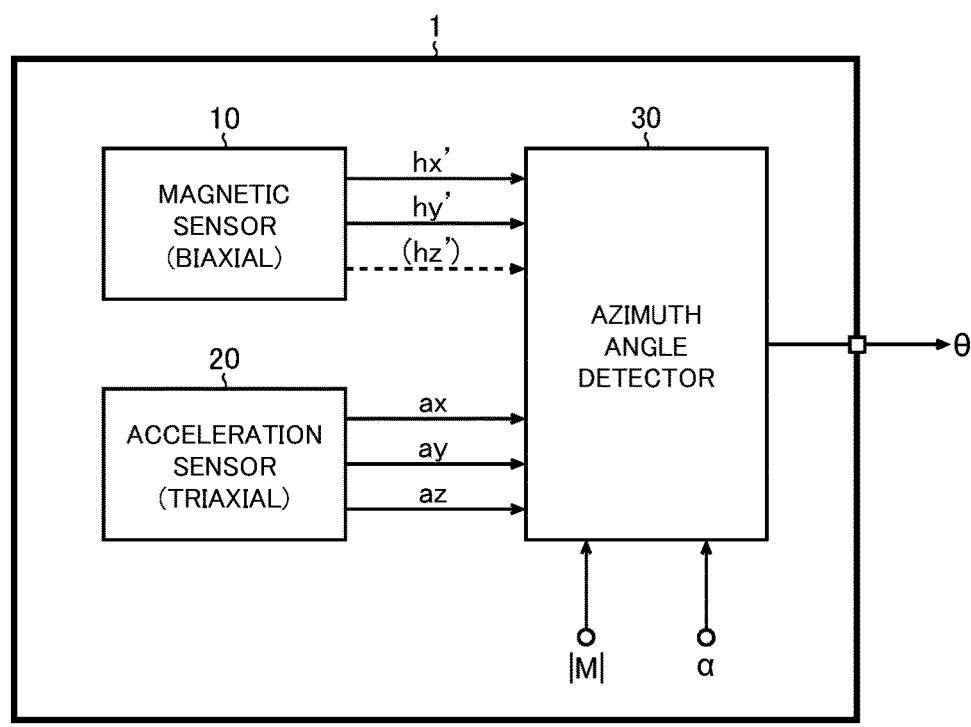
FIG. 1 A block diagram showing one configuration example of an electronic compass.

FIG. 1 is a block diagram showing one configuration example of an electronic compass. The electronic compass 1 of this configuration example has a magnetic sensor 10, an acceleration sensor 20, and an azimuth angle detector 30.

The magnetic sensor 10 is a biaxial magnetic sensor for sensing predetermined two axis components (X-axis and Y-axis components) out of three axis components (X-axis, Y-axis, and Z-axis components) of geomagnetism at a given site (the place where the electronic compass 1 is located) to generate two-axis magnetic sensing data (hx', hy') corresponding to the magnitudes of the respective components. That is, in the magnetic sensor 10, the Z-axis component of geomagnetism is not a sensing target, and thus no Z-axis magnetic sensing data hz' (see a broken line in the diagram) is generated. The axes (X-axis, Y-axis, and Z-axis) mentioned above can be designed so as to be orthogonal to each other. As the magnetic sensor 10, for example, a hall element, a magnetoresistance (MR) element, or a magnetic impedance (MI) element can be used.

The acceleration sensor 20 is a triaxial acceleration sensor for sensing three axis components (X-axis, Y-axis, and Z-axis components) of the acceleration applied to the sensor itself (and hence to the electronic compass 1) to generate three-axis acceleration sensing data (ax, ay, az) corresponding to the magnitudes of the respective components.

The azimuth angle detector 30 senses the azimuth angle θ (the direction in which the electronic compass points) based on the two-axis magnetic sensing data (hx', hy'), the three-axis acceleration sensing data (ax, ay, az), and the magnitude |M| and the magnetic dip α of geomagnetism at the site. Internal processing in the azimuth angle detector 30 will be described in detail later.

Although, in the diagram, data related to the magnetic dip α and the magnitude |M| of geomagnetism is shown to be fed from outside the azimuth angle detector 30, such data may be generated inside the azimuth angle detector 30. This will also be described later.

<Inclination Relative to the Ground Surface>

As mentioned above, the magnetic sensor 10 incorporated in the electronic compass 1 is a biaxial magnetic sensor, which is less expensive than a triaxial magnetic sensor. When sensing the azimuth angle θ using a biaxial magnetic sensor, in general, it is necessary to perform azimuth angle sensing while keeping the magnetic sensor 10 horizontal to the ground surface (FIG. 2) so that no consideration needs to be given to the inclination angle of the magnetic sensor 10 relative to the ground surface.

Figure 2:
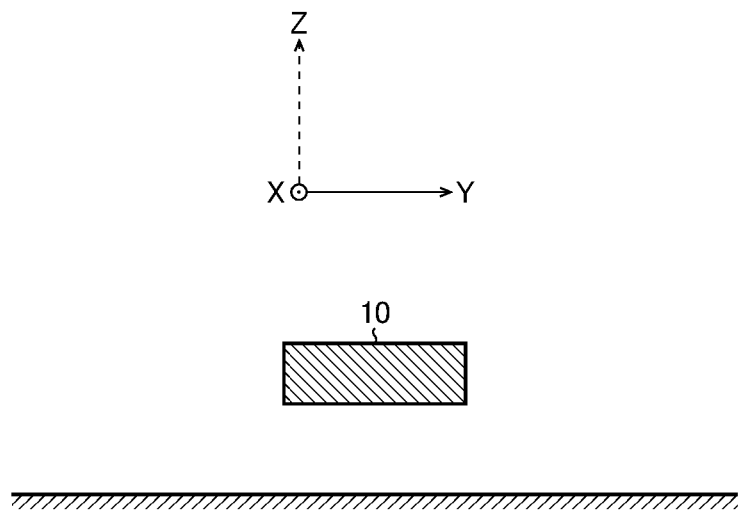
FIG. 2 A schematic diagram showing a state where a magnetic sensor is kept horizontal relative to the ground surface.
Figure 3:
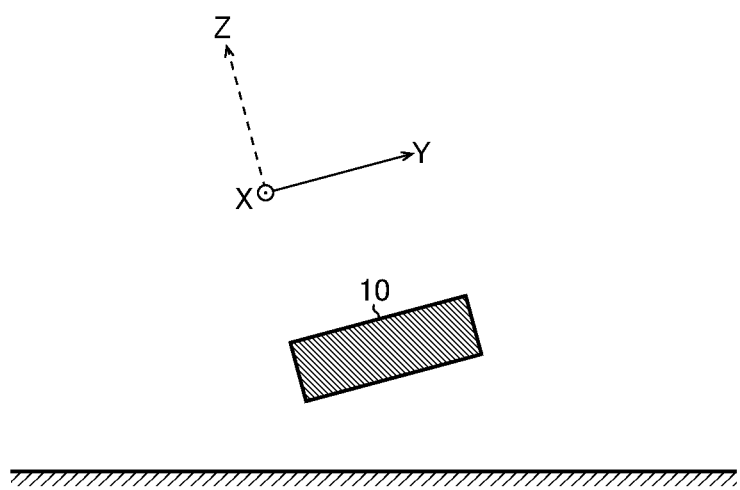
FIG. 3 A schematic diagram showing a state where the magnetic sensor is inclined relative to the ground surface.

However, many electronic appliances equipped with the electronic compass 1 are handset devices (such as mobile phones and smartphones) that are often operated while being held in a user's hand, and the magnetic sensor 10 can be inclined at varying angles to the ground surface (FIG. 3). Thus, while the azimuth angle θ is sensed, the user needs to be requested to keep the magnetic sensor 10 in a horizontal state as shown in FIG. 2, and this is hardly a practical mode of use.

As a solution, the azimuth angle detector 30 is configured to calculate virtual magnetic sensing data hz' corresponding to the Z-axis component of geomagnetism based on two-axis magnetic sensing data (hx', hy'), three-axis acceleration sensing data (ax, ay, az), and the magnitude M and the magnetic dip α of geomagnetism at a given site, thereby to determine a ground-horizontal component (which will be described in detail later) of geomagnetism, so as to be capable of sensing the azimuth angle θ correctly even if the magnetic sensor 10 is inclined relative to the ground surface.

Of particular note is that, in the azimuth angle detector 30, not only the magnitude |M| of geomagnetism but also the magnetic dip α of geomagnetism is meaningfully used in performing azimuth angle sensing. Its technical significance will be described in detail below.

<The Magnitude and the Magnetic Dip of Geomagnetism>

Figure 4:
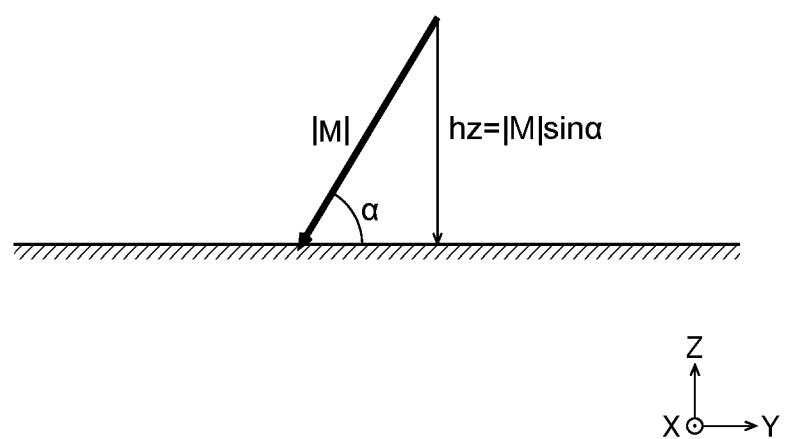
FIG. 4 A schematic diagram showing the magnitude and the magnetic dip of geomagnetism.

FIG. 4 is a schematic diagram showing the magnitude |M| and the magnetic dip α of geomagnetism. Geomagnetism (see a thick arrow in the diagram) acts from around the south pole to around the north pole, and its magnitude |M| and magnetic dip α (the angle at which geomagnetism enters the earth's surface, or the angle at which geomagnetism exits the earth's surface) are known to vary according to the latitude and the longitude of the observation site.

The magnitude |M| of geomagnetism can have different values, for example, between indoors and outdoors even at the same site. On the other hand, the magnetic dip α of geomagnetism can safely be considered to have a generally constant value regardless of whether indoors or outdoors within the range of ordinary activity of average users (within the range of local activity involving no long-distance movement by airplane or the like).

Based on the above findings, an azimuth angle sensing method proposed in the present description involves meaningfully using not only the magnitude |M| of geomagnetism but also the magnetic dip α of geomagnetism, thereby to accurately calculate virtual magnetic sensing data of the Z-axis, which is not sensed by the magnetic sensor 10, so as to achieve more accurate sensing of the azimuth angle θ.

<Azimuth Angle Sensing>

Azimuth angle sensing by the azimuth angle detector 30 will be described specifically below. First, the relationship between three-axis magnetic sensing data (hx', hy', hz') (where hz' is virtual magnetic sensing data) and three-axis projected magnetic sensing data (hx, hy, hz) obtained by projecting the three-axis magnetic sensing data to the ground-horizontal plane can be expressed by formula (1) below. Out of the three-axis projected magnetic sensing data (hx, hy, hz), hx and hy correspond to ground-horizontal components of geomagnetism respectively, and hz corresponds to a ground-vertical component of geomagnetism.

[Formula 1]

$$\begin{pmatrix} hx \\ hy \\ hz \end{pmatrix} = R^T \begin{pmatrix} hx' \\ hy' \\ hz' \end{pmatrix} = \begin{pmatrix} \cos(r) & 0 & -\sin(r) \\ \sin(p)\sin(r) & \cos(p) & \sin(p)\cos(r) \\ \cos(p)\sin(r) & -\sin(p) & \cos(p)\cos(r) \end{pmatrix} \begin{pmatrix} hx' \\ hy' \\ hz' \end{pmatrix} \quad (1)$$

Figure 5:
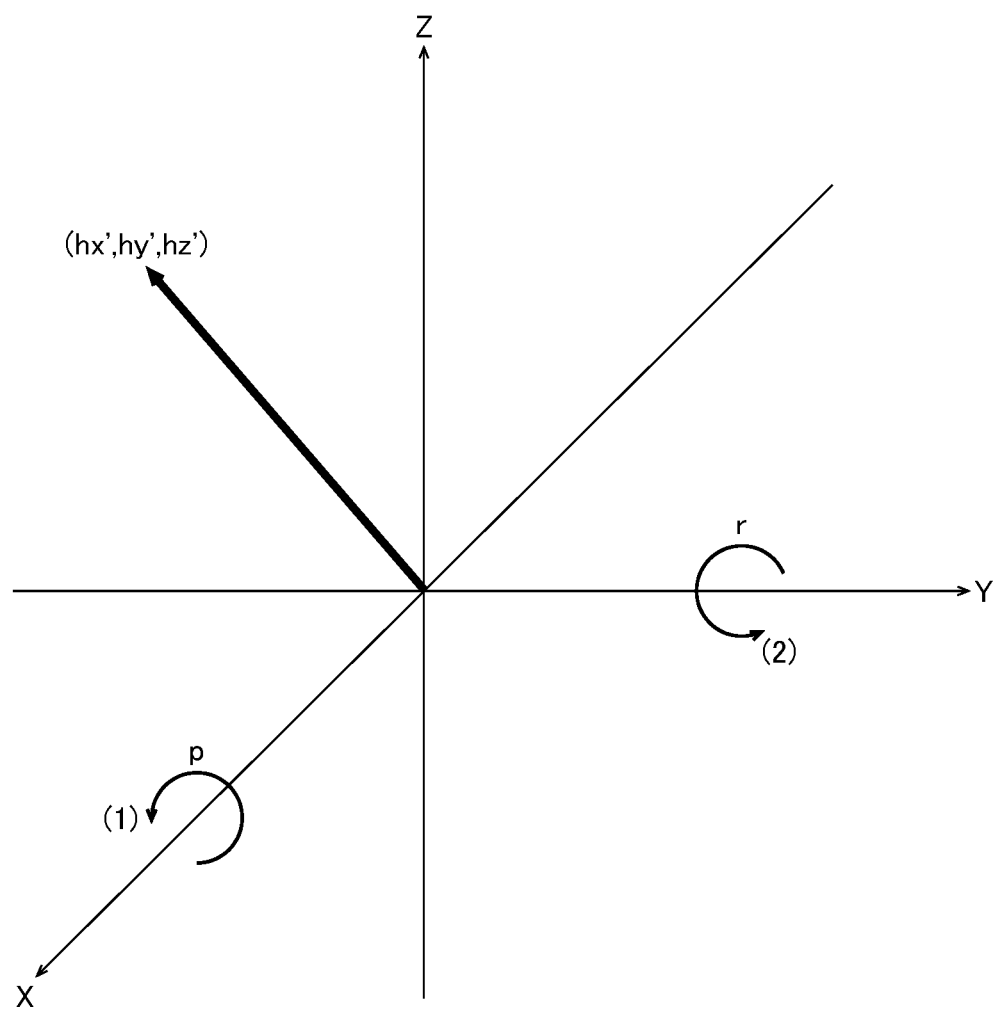
FIG. 5 A schematic diagram showing a rotation angle p around the X-axis and a rotation angle r around the Y-axis.

In formula (1) above, the rotation matrix R is, as shown in FIG. 5, a rotation matrix for rotating the three-axis magnetic sensing data (hx', hy', hz') by a rotation angle (inclination angle) p around the X-axis and then further rotating it by a rotation angle (inclination angle) r around the Y-axis, and $R^T$ its transposed matrix. The rotation matrix R is expressed by formula (2) below.

[Formula 2]

$$R = \begin{pmatrix} \cos(r) & 0 & \sin(r) \\ 0 & 1 & 0 \\ -\sin(r) & 0 & \cos(r) \end{pmatrix} \begin{pmatrix} 1 & 0 & 0 \\ 0 & \cos(p) & -\sin(p) \\ 0 & \sin(p) & \cos(p) \end{pmatrix} \quad (2)$$

$$= \begin{pmatrix} \cos(r) & \sin(p)\sin(r) & \cos(p)\sin(r) \\ 0 & \cos(p) & -\sin(p) \\ -\sin(r) & \sin(p)\cos(r) & \cos(p)\cos(r) \end{pmatrix}$$

The relationship between the three-axis acceleration sensing data (ax, ay, az), which is detected in a state inclined by a rotation angle (inclination angle) p around the X-axis and by a rotation angle (inclination angle) r around the Y axis, and gravity acceleration (0, 0, 1) can be expressed by formula (3) below.

[Formula 3]

$$\begin{pmatrix} ax \\ ay \\ az \end{pmatrix} = R \begin{pmatrix} 0 \\ 0 \\ 1 \end{pmatrix} = \begin{pmatrix} \cos(p)\sin(r) \\ -\sin(p) \\ \cos(p)\cos(r) \end{pmatrix} \quad (3)$$

Here, the output values of acceleration sensing data (ax, ay, az) are normalized respectively using formula (4) below.

[Formula 4]

$$ax \leftarrow \frac{ax}{\sqrt{ax^2 + ay^2 + az^2}}, \quad (4)$$

$$ay \leftarrow \frac{ay}{\sqrt{ax^2 + ay^2 + az^2}}, \quad az \leftarrow \frac{az}{\sqrt{ax^2 + ay^2 + az^2}}$$

Thus, the inclination angles p and r can be determined by formulae (5a) and (5b) below respectively.

[Formula 5]

$$p = -\sin^{-1}(ay), \quad \left(-\frac{\pi}{2} \le p \le \frac{\pi}{2}\right) \quad (5a)$$

$$r = \tan^{-1}\left(\frac{ax}{az}\right), \quad \left(-\frac{\pi}{2} \le r \le \frac{\pi}{2}\right) \quad (5b)$$

In the above example, rotation is performed "first around the X-axis and then around the Y-axis", but if the order is changed to "first around the Y-axis and then around the X-axis", it should be noted that the rotation matrix R and the inclination angles p and r are expressed differently than above. Specifically, in formula (2) above, the multiplication by the rotation matrix around the X-axis and by the rotation matrix around the Y-axis proceeds in the reversed order, and thus the rotation matrix R is then expressed differently, and thus the inclination angles p and r are also expressed differently. Even then, the way of thinking is quite the same as with the above example. The following continuation of detailed description assumes the use of the rotation matrix R that rotates "first around the X-axis and then around the Y-axis" (formula (2) above).

Figure 6:
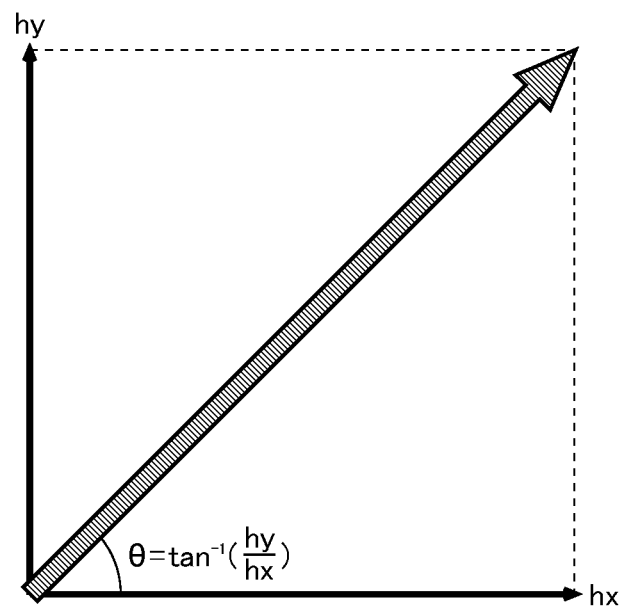
FIG. 6 A schematic diagram showing a state where azimuth angle sensing is performed based on the ground-horizontal component of geomagnetism.

Sensing the azimuth angle θ, as shown in FIG. 6, simply requires the use of the ground-horizontal components of geomagnetism, that is, out of three-axis projected magnetic sensing data (hx, hy, hz) in formula (1), only hx and hy. However, in order to calculate the ground-horizontal components hx and hy of geomagnetism, it is necessary to know the unsensed virtual magnetic sensing data hz' of the Z-axis, and thus, practically, three-axis magnetic sensing data (hx', hy', hz') is all required.

Thus, a method for calculating virtual magnetic sensing data hz' using the ground-vertical component hz of geomagnetism, which is not directly related to the sensing of the azimuth angle θ, will now be described.

Based on formula (1) above, the ground-vertical component hz of geomagnetism is expressed by formula (6) below.

[Formula 6]

$$hz = hx' \cos p \sin r - hy' \sin p + hz' \cos p \cos r \quad (6)$$

As is understood from FIG. 4 referred to previously, the ground-vertical component hz of geomagnetism can be expressed also by formula (7) below using the magnitude |M| and the magnetic dip α of geomagnetism.

[Formula 7]

$$hz = |M| \sin \alpha \quad (7)$$

Thus, based on formulae (6) and (7), virtual magnetic sensing data hz' of the Z-axis can be calculated using formula (8) below.

[Formula 8]

$$hz' = \frac{|M|\sin\alpha - (hx'\cos p \sin r - hy'\sin p)}{\cos p \cos r} \quad (8)$$

By substituting the virtual magnetic sensing data hz' in formula (1), the ground-horizontal components hx and hy of geomagnetism can be determined by formulae (9a) and (9b) below respectively.

[Formula 9]

$$hx = hx'(\cos r + \sin r \tan r) - hy'\tan p \tan r - |M|\sin\alpha\frac{\tan r}{\cos p} \quad (9a)$$

$$hy = hy'(\cos p + \sin p \tan p) + |M|\sin\alpha\tan p \quad (9b)$$

Finally, the azimuth angle θ can be calculated by formula (10) below using the ground-horizontal components hx and hy of geomagnetism.

[Formula 10]

$$\theta = \tan^{-1}\left(\frac{hy}{hx}\right) \quad (10)$$

In the sequence of azimuth angle sensing described above, the magnetic sensor 10 may require offset correction. In that case, any offset correction algorithm can be applied using two-axis magnetic sensing data (hx', hy') and one-axis virtual magnetic sensing data hz'. The inclination angles p and r used to calculate virtual magnetic sensing data hz' are determined based on acceleration sensing data (ax, ay, az), and thus it should be noted that calibration for a big action may not work well.

<Flowchart>

Figure 7:
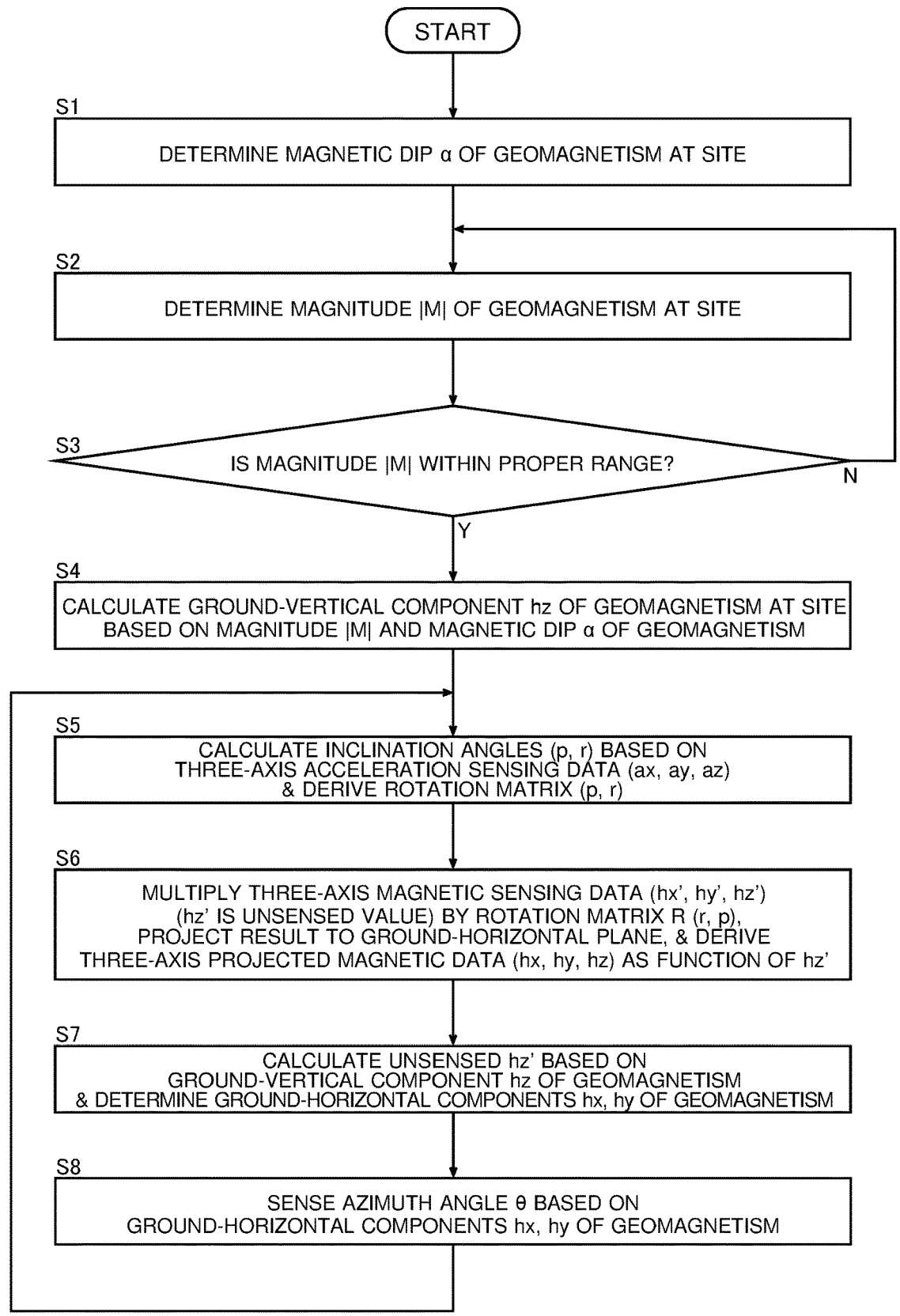
FIG. 7 A flowchart showing one example of a procedure for the azimuth angle sensing.

FIG. 7 is a flowchart showing one example of a procedure for the azimuth angle sensing explained so far. Unless specifically mentioned, the principal agent of each processing step is the azimuth angle detector 30.

First, in step S1, the magnetic dip α of geomagnetism at the site is determined. The magnetic dip α can be calculated by a predetermined approximation formula based on location information (latitude and longitude) obtained from a global positioning system (GPS), or can be derived from a magnetic dip map information library such as the one provided by Geospatial Information Authority of Japan. Another option is, instead of using a GPS, previously preparing region-specific (such as state-specific) data of the magnetic dip α. If the magnetic dip α of geomagnetism at the site is known, the value can be set automatically or by manual input. For example, the magnetic dip α is about 49 degrees in Tokyo (latitude 35 degrees north, longitude 139 degrees east), and is about 68 degrees in Berlin (latitude 52 degrees north, longitude 13 degrees east).

Next, in step S2, the magnitude |M| of geomagnetism at the site is preliminarily determined. If a triaxial magnetic sensor is used as the magnetic sensor 10, the magnitude of the resultant vector of three-axis magnetic sensing data can be regarded as the magnitude |M| of geomagnetism. However, the electronic compass 1 of this configuration example uses a biaxial magnetic sensor as the magnetic sensor 10, and thus a method other than the one just mentioned needs to be adopted.

One possible method for determining the magnitude |M| of geomagnetism is as follows. While the electronic compass 1 is moved so that the X- and the Y-axes of the magnetic sensor 10 each pass near the Z-axis, for example, as if to describe the figure of "8", two-axis magnetic sensing data (hx', hy') that changes with time is sensed successively to determine either the maximum value of the resultant vector of the two axis components or one-half of the larger of the differences between the maximum and minimum values of the two axis components. The so determined value is taken as the magnitude of geomagnetism |M|.

As the magnetic dip α is determined by one of the methods described previously, likewise the magnitude |M| of geomagnetism can be calculated by a predetermined approximation formula based on location information obtained from a GPS, or can be derived from a magnetic dip map information library such as the one provided by Geospatial Information Authority of Japan. Another option is, instead of using a GPS, previously preparing region-specific (such as state-specific) data of the magnitude |M| of geomagnetism. If the magnitude |M| of geomagnetism at the site is known, the value can be set automatically or by manual input.

Next, in step S3, it is checked whether the preliminarily determined magnitude |H| of geomagnetism is within a proper range. Here, if the check yields Yes, the procedure proceeds to Step 4, and if the check yields No, the procedure returns to step S2. The proper range just mentioned can be set with consideration given to the magnitude of geomagnetism (for example, 10 μT to 70 μT) generally observed on the earth.

If the check yields Yes in step S3, then in step S4, the ground-vertical component hz of geomagnetism is calculated based on the magnitude M and the magnetic dip α of geomagnetism using formula (7) noted previously.

Next, in step S5, based on three-axis acceleration sensing data (ax, ay, az), the inclination angles p and r of the magnetic sensor 10 relative to the ground surface (see formulae (5a) and (5b) noted previously) is calculated to derive the rotation matrix R (see formula (2) noted previously).

Next, in step S6, by multiplying three-axis magnetic sensing data (hx', hy', hz') resulting from combining together two-axis magnetic sensing data (hx', hy') and one-axis virtual magnetic sensing data hz' by the rotation matrix R (or more accurately, by its transposed matrix $R^T$), the three-axis magnetic sensing data (hx', hy', hz') is projected to the ground-horizontal plane, and thereby three-axis projected magnetic sensing data (hx, hy, hz) is determined (see formula (1) noted previously). That is, in step S6, the ground-horizontal components hx and hy and the ground-vertical component hz of geomagnetism are derived as a function of the virtual magnetic sensing data hz'.

Next, in step S7, with focus on the ground-vertical component hz of geomagnetism (formulae (6) and (7) noted previously), virtual magnetic sensing data hz' (formula (8) noted previously) is calculated, and furthermore, based on formulae (9a) and (9b) noted previously, the ground-horizontal components hx and hy of geomagnetism are determined.

Finally, in step S8, the azimuth angle θ is calculated based on the ground-horizontal components hx and hy of geomagnetism using formula (10) noted previously. Then, the procedure returns to step S5, and thereafter step S5 through S8 is repeated so that the azimuth angle θ sensing is continued.

Effects of the Invention

As explained above, with the electronic compass 1 of this configuration example, it is possible to perform as accurate orientation sensing using a biaxial magnetic sensor, which is less expensive than a triaxial magnetic sensor, as using a triaxial magnetic sensor.

The electronic compass 1 of this configuration example meaningfully uses, in azimuth angle sensing, not only the magnitude |M| of geomagnetism but also the magnetic dip α of geomagnetism, which is considered constant in local terms. Thus, even in a situation where the magnitude |M| of geomagnetism can change as one moves between indoors and outdoors (for example, as one enters or exits from a building), it is possible to correctly estimate the geomagnetism component for the unsensed axis, allowing accurate sensing of azimuth angle θ at any inclination angles.

Examples of Application of the Electronic Compass

Figure 8:
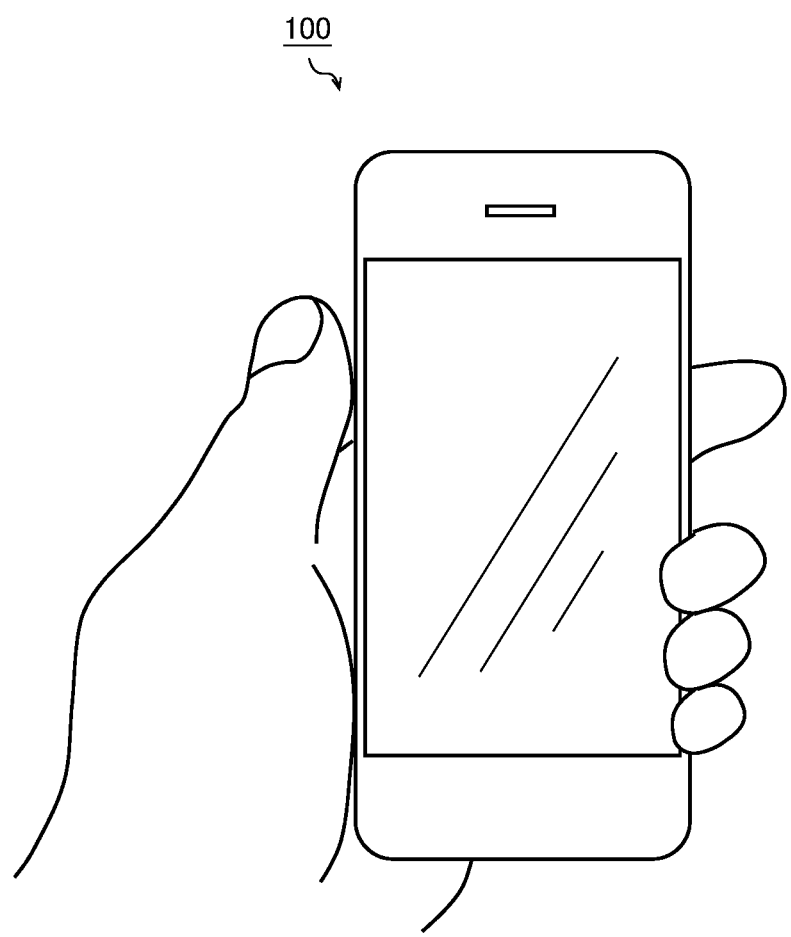
FIG. 8 An exterior view of a smartphone.
Figure 9:
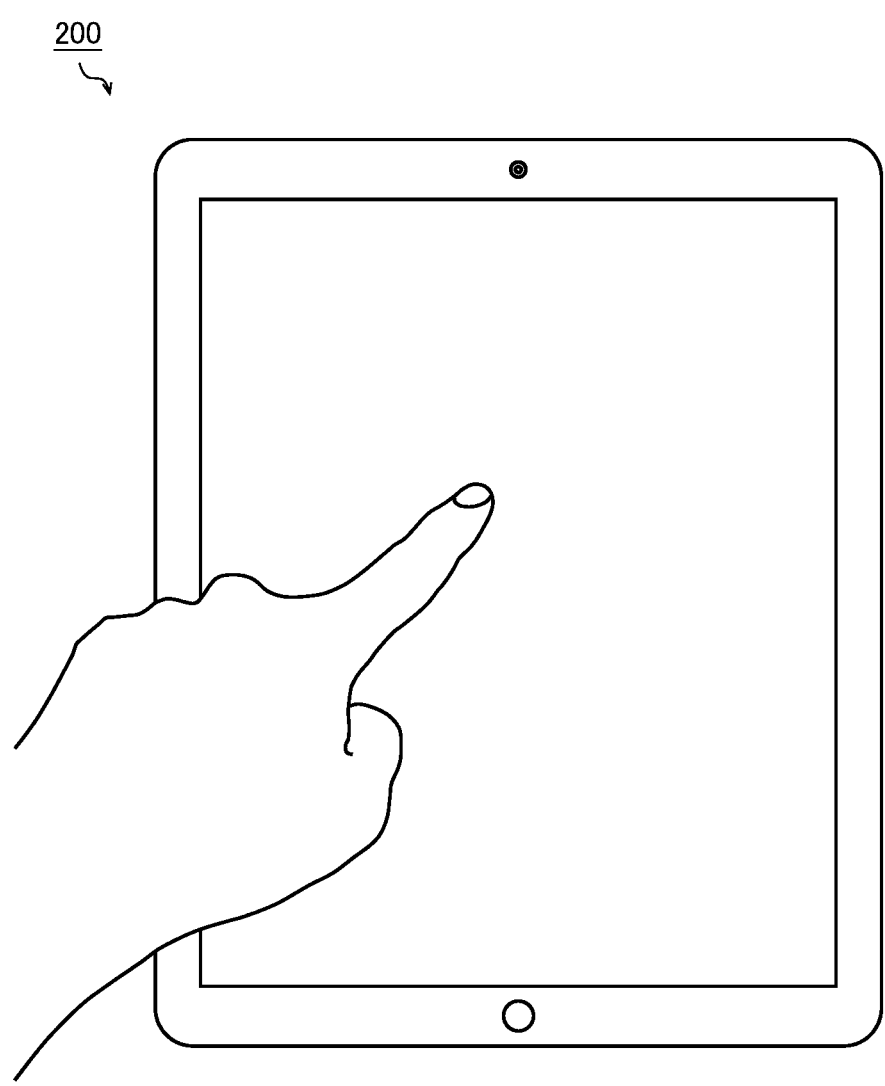
FIG. 9 An exterior view of a tablet computer.
Figure 10:
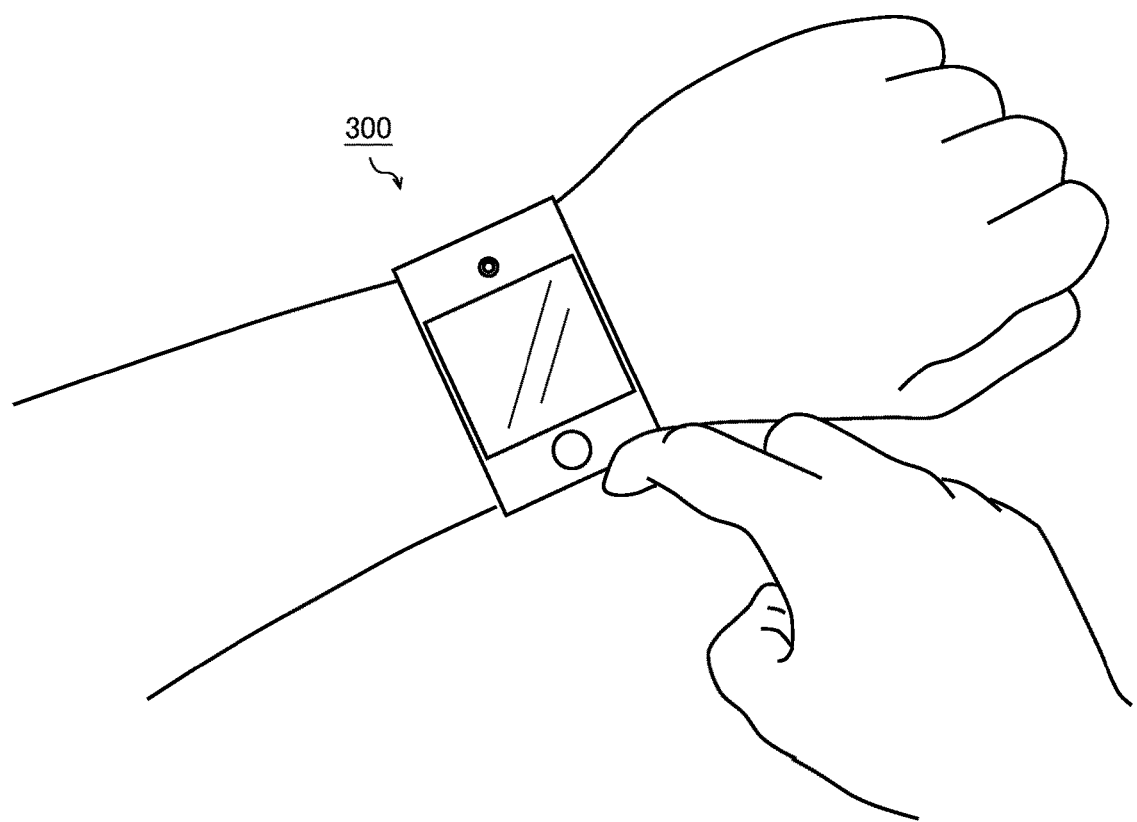
FIG. 10 An exterior view of a smartwatch.

FIGS. 8 to 10 are exterior views showing examples of electronic appliances (a smartphone 100, a tablet computer 200, and a smartwatch 300) provided with an electronic compass. Incorporating the above-mentioned electronic compass 1 in those appliances enables accurate orientation sensing. Combining a global positioning system (GPS) with the electronic compass 1, in particular, allows higher location sensing accuracy in map applications and navigation applications.

Other Modified Examples

The various technical features disclosed herein can be implemented in any other manner than in the embodiments described above and allow for many modifications and variations within the spirit of their technical ingenuity. The above embodiments should be understood to be in every aspect illustrative and not restrictive. The scope of the present disclosure is defined not by the description of the embodiments given above but by the appended claims, and should be understood to encompass any modifications made in the sense and scope equivalent to those of the claims.

INDUSTRIAL APPLICABILITY

The invention disclosed in the present description finds application in electronic compasses incorporated in handset devices such as mobile phones, smartphones, tablet computers, or smartwatches.

LIST OF REFERENCE SIGNS 1 electronic compass (azimuth angle sensor)
10 magnetic sensor
20 acceleration sensor
30 azimuth angle detector
100 smartphone
200 tablet computer
300 smartwatch

The invention claimed is:
1. An electronic compass comprising:
a magnetic sensor configured to sense predetermined two axis components out of three axis components of geomagnetism at a site to generate two-axis magnetic sensing data corresponding to magnitudes of the respective two axis components;
an acceleration sensor configured to sense three axis components of acceleration applied to the acceleration sensor to generate three-axis acceleration sensing data corresponding to magnitudes of the respective three-axis components; and
an azimuth angle detector configured
to calculate virtual magnetic sensing data corresponding to, out of the three axis components of the geomagnetism, a remaining unsensed one axis component based on the two-axis magnetic sensing data, the three-axis acceleration sensing data, and a magnitude and a magnetic dip of the geomagnetism, and
to determine, using the virtual magnetic sensing data, ground-horizontal components of the geomagnetism, thereby to sense an azimuth angle,
wherein the azimuth angle detector is configured to calculate, as one processing step, a ground-vertical component of the geomagnetism based on the magnitude and the magnetic dip of the geomagnetism,
wherein the azimuth angle detector is configured to calculate, as one processing step, an inclination angle relative to a ground surface based on the three-axis acceleration sensing data to derive a rotation matrix, and
wherein the azimuth angle detector is configured to calculate the virtual magnetic sensing data (hz'), based on the two-axis magnetic sensing data (hx' and hy'), the inclination angle (p and r), and the magnitude (|M|) and the magnetic dip (α) of the geomagnetism, by using formula (X) below:

$$hz' = \frac{|M|\sin\alpha = (hx'\cos p\sin r - hy'\sin p}{\cos p\cos r}. \quad (X)$$

2. The electronic compass according to claim 1, wherein the azimuth angle detector is configured to multiply, as one processing step, three-axis magnetic sensing data resulting from combining together the two-axis magnetic sensing data and the virtual magnetic sensing data by the rotation matrix to derive the ground-horizontal components and the ground-vertical component of the geomagnetism as a function of the virtual magnetic sensing data.

3. The electronic compass according to claim 2, wherein the azimuth angle detector is configured to calculate, as one processing step, the virtual magnetic sensing data based on a known ground-vertical component of the geomagnetism to determine the ground-horizontal components of the geomagnetism.

4. The electronic compass according to claim 3, wherein the azimuth angle detector is configured to sense, as one processing step, the azimuth angle based on the ground-horizontal components of the geomagnetism.

5. The electronic compass according to claim 1, wherein the azimuth angle detector is configured to determine, as one processing step, based on the two-axis magnetic sensing data that changes with time, either a maximum value of a resultant vector of the two axis components or one-half of a larger of differences between maximum and minimum values of the two axis components, to take the determined value as the magnitude of the geomagnetism.

6. The electronic compass according to claim 1, wherein the magnetic sensor includes a hall element, a magnetoresistance (MR) element, or a magnetic impedance (MI) element.

7. An electronic appliance comprising the electronic compass according to claim 1.

8. An azimuth angle sensing method for sensing an azimuth angle using a magnetic sensor for sensing predetermined two axis components out of three axis components of geomagnetism at a site to generate two-axis magnetic sensing data corresponding to magnitudes of the respective two axis components, and an acceleration sensor for sensing three axis components of acceleration applied to the acceleration sensor to generate three-axis acceleration sensing data corresponding to the magnitudes of the respective three axis components, the method comprising:

calculating a ground-vertical component of the geomagnetism based on a magnitude and a magnetic dip of the geomagnetism;

calculating an inclination angle relative to a ground surface based on the three-axis acceleration sensing data to derive a rotation matrix;

calculating one-axis virtual magnetic sensing data (hz'), based on the two-axis magnetic sensing data (hx' and hy'), the inclination angle (p and r), and the magnitude (|M|) and the magnetic dip (α) of the geomagnetism, by using formula (X) below:

$$hz' = \frac{|M|\sin\alpha = (hx'\cos p \sin r - hy'\sin p)}{\cos p \cos r}. \qquad (X)$$

multiplying three-axis magnetic sensing data including the two-axis magnetic sensing data and the one-axis virtual magnetic sensing data by the rotation matrix to derive ground-horizontal components and the ground-vertical component of the geomagnetism as a function of the virtual magnetic sensing data;

calculating the virtual magnetic sensing data based on a known ground-vertical component of the geomagnetism to determine the ground-horizontal components of the geomagnetism; and sensing the azimuth angle based on the ground-horizontal components of geomagnetism.

* * * * *